(12) United States Patent
Suh et al.

(10) Patent No.: US 7,910,401 B2
(45) Date of Patent: Mar. 22, 2011

(54) ORGANIC THIN FILM TRANSISTOR, FLAT PANEL DISPLAY APPARATUS COMPRISING THE SAME, AND METHOD OF MANUFACTURING THE ORGANIC THIN FILM TRANSISTOR

(75) Inventors: Min-Chul Suh, Suwon-si (KR); Taek Ahn, Suwon-si (KR); Jin-Seong Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/706,836

(22) Filed: Feb. 17, 2010

(65) Prior Publication Data

US 2010/0151622 A1 Jun. 17, 2010

Related U.S. Application Data

(62) Division of application No. 11/546,342, filed on Oct. 12, 2006, now Pat. No. 7,692,185.

(30) Foreign Application Priority Data

Oct. 24, 2005 (KR) .................. 10-2005-0100278

(51) Int. Cl.
*H01L 51/40* (2006.01)

(52) U.S. Cl. .................. 438/99; 438/149; 257/E21.007

(58) Field of Classification Search .................. 438/99, 438/149; 257/40, E21.007
See application file for complete search history.

(56) References Cited

U.S. PATENT DOCUMENTS

| 7,355,198 B2 * | 4/2008 | Suh et al. ............... 257/40 |
| 7,432,525 B2 | 10/2008 | Mizusaki et al. |
| 2006/0108581 A1 | 5/2006 | Ahn et al. |

OTHER PUBLICATIONS

U.S. Appl. No. 11/546,342, filed Oct. 12, 2006, Min-Chul Suh et al, Samsung Mobile Display Co., Ltd.

* cited by examiner

*Primary Examiner* — Quoc D Hoang
(74) *Attorney, Agent, or Firm* — Stein McEwen, LLP

(57) ABSTRACT

An organic thin film transistor that can reduce contact resistance between source and drain electrodes and an organic semiconductor layer and can be readily manufactured, a flat panel display apparatus utilizing the organic thin film transistor, and a method of manufacturing the organic thin film transistor. The organic thin film transistor includes: a substrate; a source electrode and a drain electrode disposed on the gate insulating film; a conductive polymer layer disposed to cover at least a portion of each of source and drain electrodes; a hydrophobic material layer disposed on the substrate and the source and drain electrodes except regions where the conductive polymer layer are formed; an organic semiconductor layer electrically connected to the source and drain electrodes; a gate insulating film disposed to cover the organic semiconductor layer; and a gate electrode disposed on the gate insulating film.

16 Claims, 4 Drawing Sheets

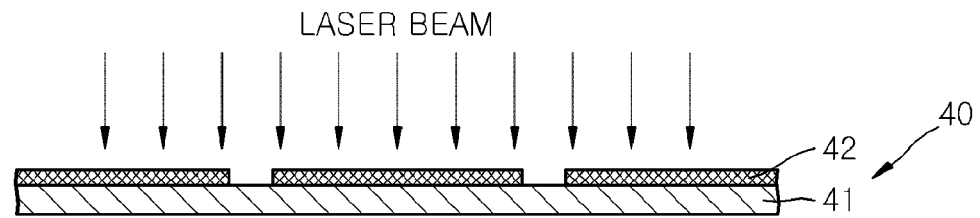
FIG. 1
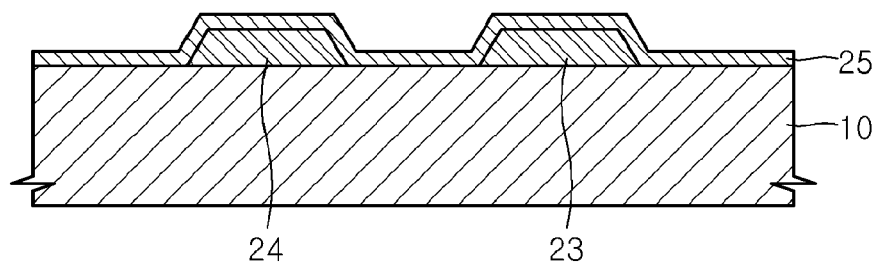
FIG. 2
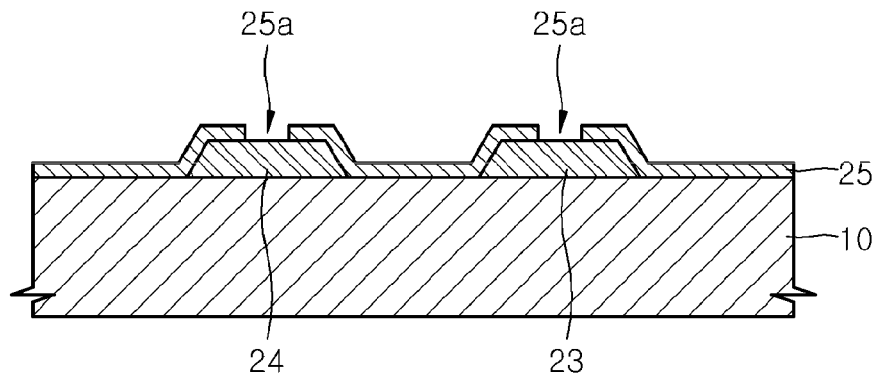
FIG. 3
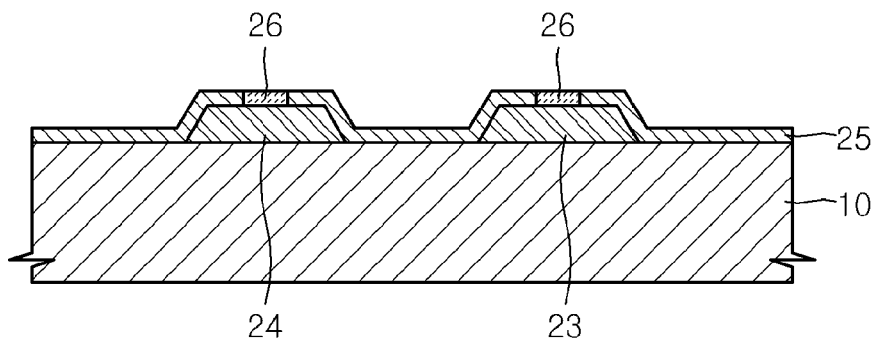

ORGANIC THIN FILM TRANSISTOR, FLAT PANEL DISPLAY APPARATUS COMPRISING THE SAME, AND METHOD OF MANUFACTURING THE ORGANIC THIN FILM TRANSISTOR

CROSS-REFERENCE TO RELATED PATENT APPLICATIONS

This application is a divisional application of U.S. patent application Ser. No. 11/546,342, filed Oct. 12, 2006, now U.S. Pat. No. 7,692,185, which claims the benefit of Korean Application No. 10-2005-0100278, filed Oct. 24, 2005, in the Korean Intellectual Property Office, the disclosures of which are incorporated herein in their entirety by reference.

BACKGROUND OF THE INVENTION

1. Field of the Invention

Aspects of the present invention relate to an organic thin film transistor, a flat panel display apparatus comprising the same, and a method of manufacturing the organic thin film transistor, and more particularly, to an organic thin film transistor that has a significantly reduced contact resistance between source and drain electrodes and an organic semiconductor layer, and can be easily manufactured, a flat panel display apparatus having the same, and a method of manufacturing the organic thin film transistor.

2. Description of the Related Art

Since the development of polyacetylene which is a conjugated organic polymer having semiconductor characteristics, due to its advantages, such as versatility of synthesis, easy formability into a fiber or a film, high flexibility, high conductivity, and low cost, many studies about transistors using the organic material in functional electronic devices and optical devices have been performed.

Conventional silicon thin film transistors include a semiconductor layer having source and drain regions doped with a high concentration of dopant and a channel region formed between the source and drain regions, a gate electrode insulated from the semiconductor layer and located on a region corresponding to the channel region, and source and drain electrodes which respectively contact the source and drain regions.

However, the conventional silicon thin film transistor having the above mentioned structure has drawbacks in that it requires high manufacturing costs, is fragile, and is impossible to use with a plastic substrate since the transistor is produced at a high temperature of 300° C. or more.

Particularly, in flat panel display apparatuses such as a liquid crystal device or an organic light emitting diode, thin film transistors are used as switching devices that control operations of each pixel and driving devices of each of the pixels. To meet the flexibility required together with the thin and large sizes required in the flat panel display apparatuses, the use of a plastic substrate instead of the conventional glass substrate has been attempted. However, when a plastic substrate is used, as described above, a low temperature process must be employed. Therefore, it is difficult to use the conventional silicon thin film transistors.

However, these problems can be solved when an organic film is used as a semiconductor layer of a thin film transistor. Therefore, recently, studies to use the organic thin film transistor as an organic thin film transistor have increased and are now being actively conducted.

However, in the organic thin film transistor, there is a high contact resistance between source and drain electrodes and an organic semiconductor layer.

That is, unlike a silicon semiconductor layer included in a conventional silicon thin film transistor, an organic semiconductor layer included in an organic thin film transistor cannot be doped with a high concentration. Therefore, there is a high contact resistance between source and drain electrodes and an organic semiconductor layer.

SUMMARY OF THE INVENTION

Aspects of the present invention provide an organic thin film transistor that has a reduced contact resistance between source and drain electrodes and an organic semiconductor layer and can be easily manufactured, a flat panel display apparatus having the same, and a method of manufacturing the organic thin film transistor.

According to an aspect of the present invention, there is provided an organic thin film transistor comprising: a substrate; a source electrode and a drain electrode disposed on the substrate; a conductive polymer layer disposed to cover at least a portion of each of the source and drain electrodes; a hydrophobic material layer disposed on the substrate and the source and drain electrodes except regions where the conductive polymer layer is formed; an organic semiconductor layer electrically connected to the source and drain electrodes; a gate insulating film disposed to cover the organic semiconductor layer; and a gate electrode disposed on the gate insulating film.

According to another aspect of the present invention, there is provided an organic thin film transistor comprising: a substrate; a gate electrode disposed on the substrate; a gate insulating film covering the gate electrode; a source electrode and a drain electrode disposed on the gate insulating film; a conductive polymer layer disposed to cover at least a portion of each of the source and drain electrodes; a hydrophobic material layer disposed on the substrate and the source and drain electrodes except for regions where the conductive polymer layer is formed; and an organic semiconductor layer electrically connected to the source and drain electrodes.

While not required in all aspects, the conductive polymer layer may be disposed to cover an edge of the source electrode in a drain electrode direction and an edge of the drain electrode in a source electrode direction. While not required in all aspects, the conductive polymer layer may be disposed to cover the source and drain electrodes. While not required in all aspects, the source and drain electrodes may be transparent electrodes. While not required in all aspects, the source and drain electrodes may be formed of indium tin oxide (ITO), indium doped zinc oxide (IZO), zinc oxide (ZnO), or indium oxide ($In_2O_3$).

While not required in all aspects, the hydrophobic material layer may be formed of a surface treatment agent that has a self-assembled monolayer including silane moiety having 1-3 reactive halogen atoms or alkoxy moieties, and including 1-3 hydrophobic moieties. While not required in all aspects, the hydrophobic material layer may be formed of a surface treatment agent that has a hydrophobic self-assembled monolayer having a trichlorosilanyl moiety or a trialkoxysilanyl moiety at the end thereof. While not required in all aspects, the hydrophobic material layer may be formed of octadecyltrichlorosilane (OTS). While not required in all aspects, the conductive polymer layer may be formed of polyethylene dioxythiophene (PEDOT) or polyaniline (PANI).

According to another aspect of the present invention, there is provided a flat panel display apparatus having an organic thin film transistor described above. According to another aspect of the present invention, there is provided a method of manufacturing an organic thin film transistor, comprising: forming source and drain electrodes on a substrate; forming a hydrophobic material layer covering the source and drain electrodes on an entire surface of the substrate; removing the hydrophobic material layer at least on a region of each of the source and drain electrodes; forming a conductive polymer layer on regions where the hydrophobic material layer is removed; forming an organic semiconductor layer to be electrically connected to the source and drain electrodes; forming a gate insulating film covering the organic semiconductor layer; and forming a gate electrode on the gate insulating film.

According to another aspect of the present invention, there is provided a method of manufacturing an organic thin film transistor, comprising: forming a gate electrode on a substrate; forming a gate insulating film covering the gate electrode; forming source and drain electrodes on the gate insulating film; forming a hydrophobic material layer covering the source and drain electrodes on an entire surface of the substrate; removing the hydrophobic material layer at least on a region of each of the source and drain electrodes; forming a conductive polymer layer on regions where the hydrophobic material layer is removed; and forming an organic semiconductor layer to be electrically connected to the source and drain electrodes.

While not required in all aspects, the removing of the hydrophobic material layer may be removing the hydrophobic material layer on an edge of the source electrode in a drain electrode direction and removing the hydrophobic material layer on an edge of the drain electrode in a source electrode direction. While not required in all aspects, the removing of the hydrophobic material layer may be removing the hydrophobic material layer on the source electrode and removing the hydrophobic material layer on the drain electrode. While not required in all aspects, the source electrode or the drain electrode may be formed of a transparent material. While not required in all aspects, the source electrode or the drain electrode may be formed of ITO, IZO, ZnO, or $In_2O_3$.

While not required in all aspects, the hydrophobic material layer may be formed of a surface treatment agent that has a self-assembled monolayer including silane moiety having 1-3 reactive halogen atoms or alkoxy moieties, and including 1-3 hydrophobic moieties. While not required in all aspects, the hydrophobic material layer may be formed of a surface treatment agent that has a hydrophobic self-assembled monolayer having a trichlorosilanyl moiety or a trialkoxysilanyl moiety at the end thereof. While not required in all aspects, the hydrophobic material layer may be formed of OTS.

While not required in all aspects, the conductive polymer layer may be formed of PEDOT or PANI. While not required in all aspects, the forming of the hydrophobic material layer may be performed using a spin coating method or a dipping method. While not required in all aspects, the removing of the hydrophobic material layer may be performed by irradiating a laser beam onto regions where the hydrophobic material layer is removed.

While not required in all aspects, the forming of the conductive polymer layer may be performed using a spin coating method, a dipping method, or an inkjet printing method. While not required in all aspects, the forming of the conductive polymer layer may comprise: forming the conductive polymer layer in regions on the source and drain electrodes where the hydrophobic material layer is removed using a spin coating method, a dipping method, or an inkjet printing method; and removing the conductive polymer layer remaining on a region between the source and drain electrodes.

While not required in all aspects, the removing of the conductive polymer layer remaining on a region between the source and drain electrodes may be performed by irradiating a laser beam, ultraviolet rays, or an electron beam onto the region between the source and drain electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1 through 4 are cross-sectional views illustrating a process of manufacturing an organic thin film transistor according to an embodiment of the present invention;

DETAILED DESCRIPTION OF THE EMBODIMENTS

Figure 4:
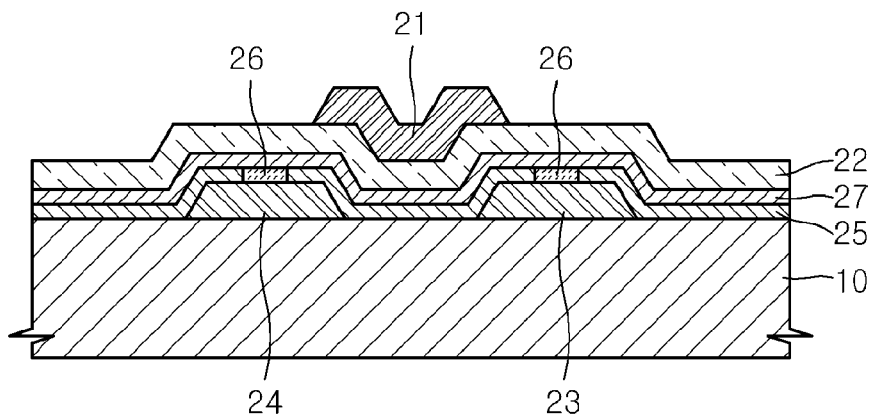

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIGS. 1 through 4 are cross-sectional views illustrating a process of manufacturing an organic thin film transistor according to an embodiment of the present invention. Referring to FIG. 1, a source electrode 23 and a drain electrode 24 are formed on a substrate 10. A hydrophobic material layer 25 covering the source electrode 23 and the drain electrode 24 is formed on an entire surface of the substrate 10. The substrate 10 can be a glass substrate, a plastic substrate such as an acryl substrate, or a metal plate substrate. Of course, the substrate included in the organic thin film transistor according to the present embodiment is not limited thereto.

The source and drain electrodes 23 and 24 can be formed by various ways on the substrate 10 using various conductive materials, for example, by patterning a conductive layer deposited on an entire surface of the substrate 10, depositing patterned source and drain electrodes on a predetermined region of the substrate using a mask, or using an inkjet printing method.

As will be described later, the organic thin film transistor can be included in a pixel unit of a flat panel display apparatus. In such a case, the source electrode 23 or the drain electrode 24 of the organic thin film transistor is electrically coupled to one electrode of each pixel. At this time, if necessary, the source electrode 23 or the drain electrode 24 of the organic thin film transistor and the coupled electrode of the pixel can be formed as a single body. In this case, when the pixel electrode must be transparent, the source electrode 23 or the drain electrode 24 also can be formed of a transparent material. The transparent material can be ITO, IZO, ZnO, $In_2O_3$, etc.

The hydrophobic material layer 25 is formed on an entire surface of the substrate 10 to cover the source electrode 23 and the drain electrode 24. The hydrophobic material layer 25 may be formed of a surface treatment agent that has a self-assembled monolayer including silane moiety having 1-3 reactive halogen atoms or alkoxy moieties, and 1-3 hydrophobic moieties, and particularly, a surface treatment agent may have a hydrophobic self-assembled monolayer having a trichlorosilanyl moiety or a trialkoxysilanyl moiety at the end thereof. Such a surface treating agent can be octadecyltrichlorosilane (OTS). Since the hydrophobic material layer 25 is formed on the entire surface of the substrate 10, the hydrophobic material layer 25 can be readily formed using a spin coating method or a dipping method.

After the hydrophobic material layer 25 is formed, at least a portion of the hydrophobic material layer 25 on each of the source electrode 23 and the drain electrode 24 is removed. For example, as depicted in FIG. 1, the hydrophobic material layer 25 can be removed by irradiating a laser beam onto a region where the hydrophobic material layer 25 is to be removed. There are various methods to irradiate a laser beam onto a region where the hydrophobic material layer 25 is to be removed. For example, as depicted in FIG. 1, a photomask 40 formed of a shielding material 42 in a predetermined pattern that blocks transmission of the laser beam that is formed on a transparent plate 41 can be used.

Referring to FIG. 2, a portion of the hydrophobic material layer 25 on each of the source electrode 23 and the drain electrode 24 is removed, and thus a portion of each of the source electrode 23 and the drain electrode 24 is exposed through openings 25a formed in the hydrophobic material layer 25.

Referring to FIG. 3, afterward, a conductive polymer layer 26 is formed in each of the regions 25a on the source electrode 23 and the drain electrode 24 where the hydrophobic material layer 25 is removed. The conductive polymer layer 26 can be formed of various materials, for example, polyethylene dioxythiophene (PEDOT) or polyaniline (PANI).

The conductive polymer layer 26 can be formed using various methods such as an inkjet printing method. In particular, the use of a dipping method or a spin coating method is advantageous in view of simplifying the processing and reducing manufacturing time. That is, due to the characteristics of the hydrophobic material layer 25, a conductive polymer layer does not form on the hydrophobic material layer 25. Accordingly, when the dipping method or the spin coating method is used, the conductive polymer layer 26 is naturally formed only on the source electrode 23 and the drain electrode 24 where the hydrophobic material layer 25 is not present.

When the manufacture of an organic thin film transistor is completed, a channel is formed between the source electrode 23 and the drain electrode 24 according to predetermined conditions. For this purpose, when the conductive polymer layer 26 is formed, a conductive polymer material should not remain between the source electrode 23 and the drain electrode 24. Of course, the conductive polymer material layer cannot be formed between the source electrode 23 and the drain electrode 24 where the hydrophobic material layer 25 is present, but in some cases, the conductive polymer material can remain. Accordingly, an operation for removing the conductive polymer material remaining in a region between the source electrode 23 and the drain electrode 24 can further be included at this time. For example, the conductive polymer material can be readily removed by irradiating a laser beam, ultraviolet rays, or an electron beam onto the region between the source electrode 23 and the drain electrode 24.

Referring to FIG. 4, the manufacture of an organic thin film transistor is completed by forming an organic semiconductor layer 27 electrically connected to the source electrode 23 and the drain electrode 24, a gate insulating film 22 covering the organic semiconductor layer 27, and a gate electrode 21 on the gate insulating film 22.

The organic semiconductor layer 27 is formed of an organic material having semiconductor characteristics, for example, including at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyplorene and its derivatives, polythiopenevinylene and its derivatives, polythiophene-hetero ring aromatic copolymer and its derivatives, oligoacen of naphthalene and its derivatives, alpha-5-thiophene oligothiophene and its derivatives, phthalocianin that does not include a metal and its derivatives, phyromeliticdianhydride and its derivatives, phyromelitic diimid and its derivatives, perrylenetetracarboxy acid dianhydride and its derivatives, and perrylenetetracarboxilic diimid and its derivatives. The organic semiconductor layer 27 can be formed using various methods such as an inkjet printing method, a dipping method, a spin coating method, etc.

The gate insulating film 22 can be formed of an inorganic material such as a silicon oxide or a silicon nitride, or an organic material such as parylene, epoxy, PVC, BCB, or CYPE to improve flexibility of the thin film transistor after the manufacturing of the thin film transistor is completed.

As described above, there is a problem of low on-current flow and low on/off ratio of an organic thin film transistor due to the high contact resistance between the source and drain electrodes 23 and 24 and the organic semiconductor layer 27. Therefore, by interposing the conductive polymer layer 26 between the source and drain electrodes 23 and 24 and the organic semiconductor layer 27, a potential barrier caused by an energy difference between a fermi level of the source and drain electrodes 23 and 24 and a highest occupied molecular orbit (HOMO) energy level or a lowest unoccupied molecular orbit (LUMO) energy level of the organic semiconductor layer 27 can be reduced. As a result, the characteristics of the organic thin film transistor can be significantly improved by reducing the contact resistance between the source and drain electrodes 23 and 24 and the organic semiconductor layer 27.

Figure 5:
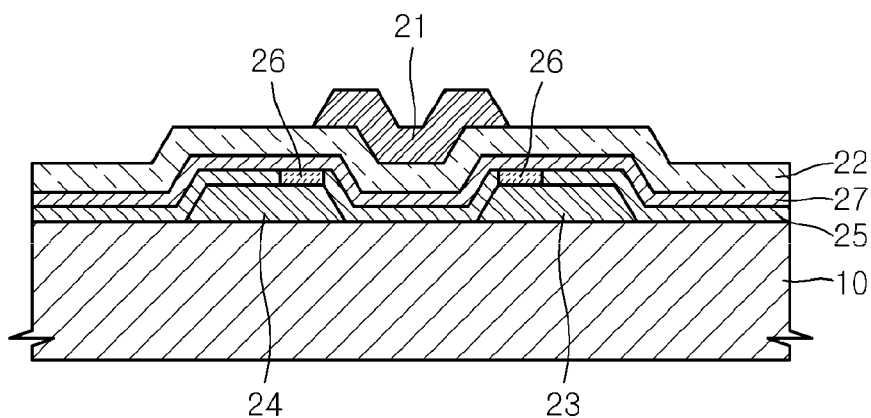
FIG. 5 is a cross-sectional view of a modified organic thin film transistor from the organic thin film transistor of FIG. 4 according to an embodiment of the present invention.

FIG. 5 is a cross-sectional view of a modified organic thin film transistor from the organic thin film transistor of FIG. 4 according to an embodiment of the present invention. In the organic thin film transistor depicted in FIG. 4, the openings 25a (refer to FIG. 2) formed in the hydrophobic material layer 25 are respectively formed on regions corresponding to a central portion of the source and drain electrodes 23 and 24. Accordingly, the conductive polymer layer 26 is respectively formed on the central portion of the source and drain electrodes 23 and 24. The source and drain electrodes 23 and 24 are electrically connected to each other according to predetermined electrical signals applied to the gate electrode 21 through a channel formed in the organic semiconductor layer 27. At this time, as described above, the source and drain electrodes 23 and 24 may be electrically connected to each other through the conductive polymer layer 26 formed on the source and drain electrodes 23 and 24 to reduce contact resistance between the source and drain electrodes 23 and 24 and the organic semiconductor layer 27.

Figure 6:
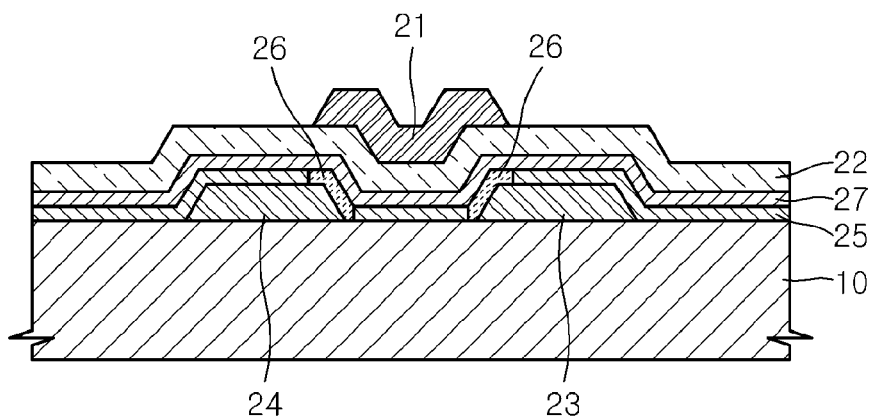
FIG. 6 is a cross-sectional view of another modified organic thin film transistor from the organic thin film transistor of FIG. 4 according to an embodiment of the present invention.
Figure 7:
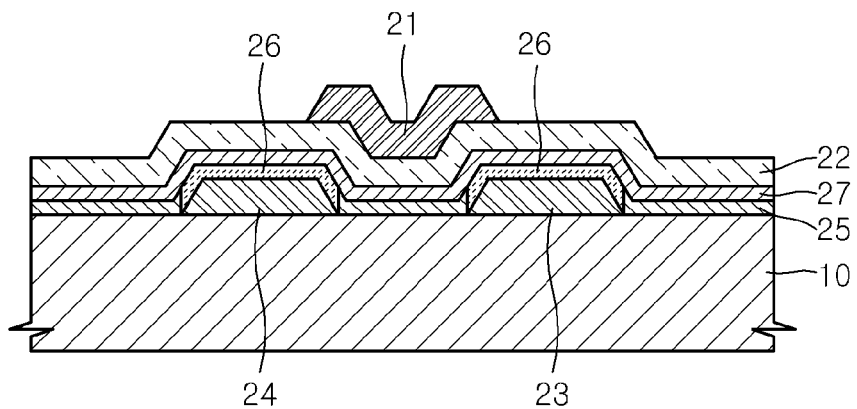
FIG. 7 is a cross-sectional view of another modified organic thin film transistor from the organic thin film transistor of FIG. 4 according to an embodiment of the present invention.

Accordingly, as depicted in FIG. 5, the conductive polymer layer 26 may be formed in a shape covering an edge portion of the source electrode 23 in a drain electrode 24 direction, and an edge portion of the drain electrode 24 in a source electrode 23 direction. Here, the edge portion includes an end portion. The conductive polymer layer 26 can be formed in various ways. For example, the conductive polymer layer 26 can be formed in a shape covering an end portion of the source electrode 23 in a drain electrode direction and an end portion of the drain electrode 24 in a source electrode direction as depicted in FIG. 6. Also, as depicted in FIG. 7, the conductive polymer layer 26 can be formed to cover the source and drain electrodes 23 and 24.

Figure 8:
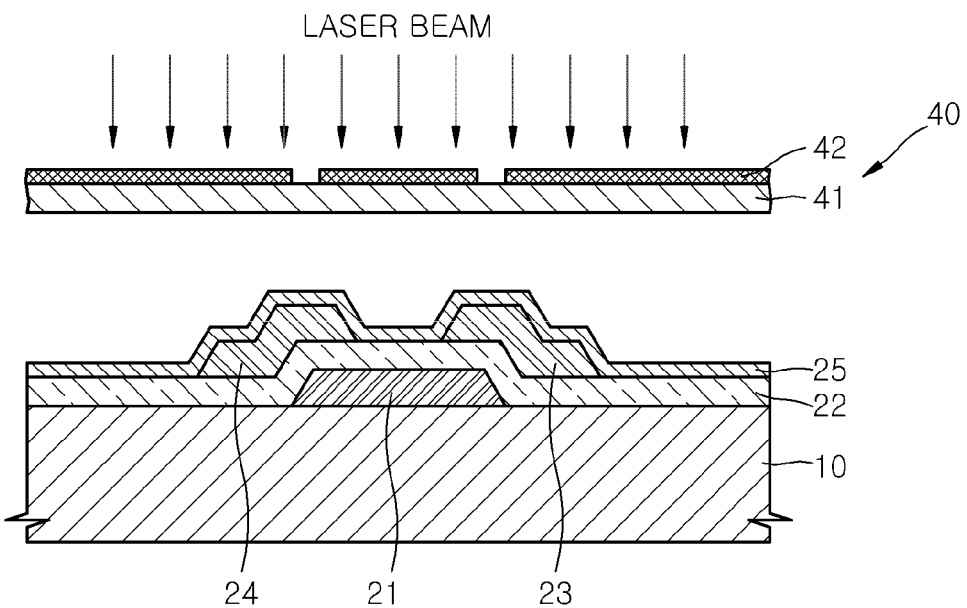
FIGS. 8 through 10 are cross-sectional views illustrating a method of manufacturing an organic thin film transistor according to another embodiment of the present invention.
Figure 9:
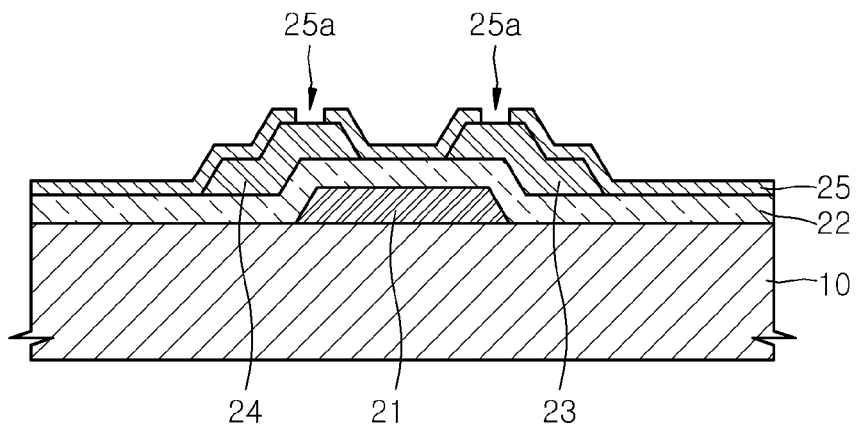
Figure 10:
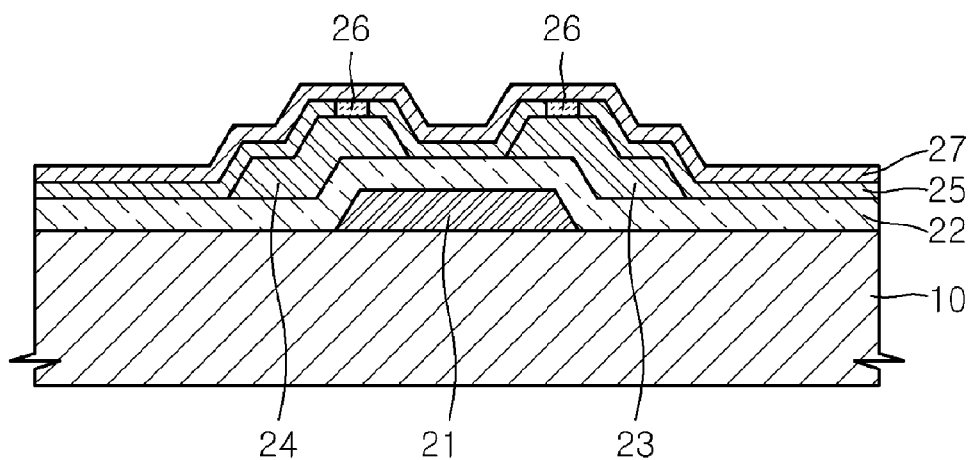

FIGS. 8 through 10 are cross-sectional views illustrating a process of manufacturing an organic thin film transistor according to another embodiment of the present invention. The organic thin film transistors according to embodiments of the present invention and modified embodiments are staggered organic thin film transistors in which the gate electrode is formed over source and drain electrodes and an organic semiconductor layer is formed on the source and drain electrodes in each embodiment, but the present invention is not limited thereto. For example, aspects of the present invention can also be applied to an inverted coplanar organic thin film transistor in which source and drain electrodes are formed over a gate electrode and an organic semiconductor layer is formed on the source and drain electrodes.

That is, referring to FIG. 8, a gate electrode 21 is formed on a substrate 10, a gate insulating film 22 covering the gate electrode 21 is formed, source and drain electrodes 23 and 24 are formed on the gate insulating film 22, and a hydrophobic material layer 25 covering the source and drain electrodes 23 and 24 is formed on an entire surface of the substrate 10. Afterward, as depicted in FIG. 9, openings 25a are formed to expose a portion of each of the source and drain electrodes 23 and 24 by removing at least a portion of the hydrophobic material layer 25 on each of the source and drain electrodes 23 and 24 using any one of various methods such as the irradiation of a laser beam using a photomask 40 as depicted in FIG. 8. Afterward, a conductive polymer layer 26 is formed on the source and drain electrodes 23 and 24 where the hydrophobic material layer 25 is removed. Next, an organic semiconductor layer 27, electrically connected to the source and drain electrodes 23 and 24, is formed. As a result, an inverted coplanar type organic thin film transistor as depicted in FIG. 10 is manufactured.

Figure 11:
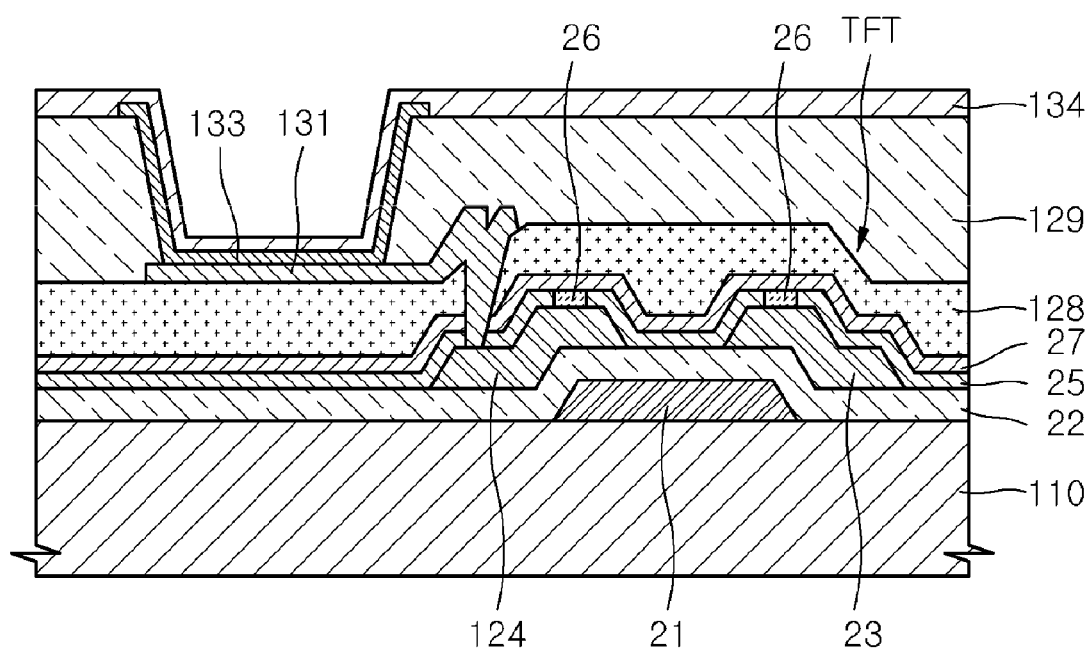
FIG. 11 is a cross-sectional view of a flat panel display apparatus according to an embodiment of the present invention.

FIG. 11 is a cross-sectional view of a flat panel display apparatus according to an embodiment of the present invention. As described above, due to its high flexibility, the organic thin film transistors can be used for various flexible flat panel display apparatuses having a thin film transistor. The flat panel display apparatus includes various display apparatuses such as a liquid crystal display apparatus and an organic light emitting diode. Here, an organic light emitting display apparatus having an organic thin film transistor as described above will now be briefly described with reference to FIG. 11.

In a light emitting display apparatus having organic thin film transistors according to various embodiments of the present invention, the organic thin film transistor and the light emitting diode are included on a substrate 110. Various organic light emitting display apparatuses can be applied to aspects of the present invention. The organic light emitting display apparatus according to an embodiment of the present invention is an active matrix (AM) light emitting display apparatus having an organic thin film transistor.

Referring to FIG. 11, each of the sub-pixels includes at least one organic thin film transistor. A buffer layer (not shown) can be formed on the substrate 110 using $SiO_2$, if necessary, and an organic thin film transistor as described above is included on the buffer layer. Of course, the organic thin film transistor depicted in FIG. 11 is one of the various organic thin film transistors according to embodiments and modified embodiments of the present invention, however the present invention is not limited thereto.

A passivation film 128 is formed on the organic thin film transistor using $SiO_2$, and a pixel defining film 129 is formed on the passivation film 128 using acrylic or polyimide compound. The passivation film 128 serves as a protection film that protects the organic thin film transistor and serves as a planarizing film that planarizes an upper surface thereof.

Although not shown, at least one capacitor can be connected to the organic thin film transistor. A circuit that includes the organic thin film transistor is not necessarily limited to the circuit depicted in FIG. 11, but can have various modifications.

An organic light emitting diode is connected to a drain electrode 124. The organic light emitting diode includes an intermediate layer 133 that includes a pixel electrode 131, a facing electrode 134, and at least one light emitting layer interposed between the pixel electrode 131 and the facing electrode 134. The facing electrode 134 can have various forms, for example, the facing electrode 134 can be formed in common to a plurality of pixels.

In FIG. 11, for convenience of explanation of the structure of the sub-pixel, the intermediate layer 133 is patterned to correspond to the sub-pixel, but the intermediate layer 133 can be formed in one unit with an intermediate layer of an adjacent sub-pixel. Also, the intermediate layer 133 can be formed in various ways, for example, a portion of the intermediate layer 133 can be formed in each sub-pixel and the other portion of the intermediate layer 133 can be formed in one unit with an intermediate layer of an adjacent sub-pixel.

The pixel electrode 131 functions as an anode electrode and the facing electrode 134 functions as a cathode electrode, but the polarity of the pixel electrode and the facing electrode may be reversed. The pixel electrode 131 can be formed as a transparent electrode or a reflection electrode. When the pixel electrode 131 is formed as a transparent electrode, the pixel electrode 131 can be formed of ITO, IZO, ZnO or $In_2O_3$, and when the pixel electrode 131 is formed as a reflection electrode, the pixel electrode 131 can be formed of ITO, IZO, ZnO or $In_2O_3$ on a reflection film after forming the reflection film using Ag, Mg, Al, Pt, Pd, Au, Ni, Nd, Ir, Cr, or a compound of these metals.

The facing electrode 134 can be formed as a transparent electrode or a reflection electrode. When the facing electrode 134 is formed as a transparent electrode, after depositing a metal having a low work function, such as Li, Ca, LiF/Ca, LiF/Al, Al, Ag, Mg, or a compound of these metals on the intermediate layer 133, an auxiliary electrode layer or a bus electrode line formed of a material for forming the transparent electrode, such as ITO, IZO, ZnO or $In_2O_3$, can be included on the material layer. When the facing electrode 134 is formed as a reflection electrode, the facing electrode 134 is entirely formed by depositing Li, Ca, LiF/Ca, LiF/Al, Al, Ag, Mg, or a compound of these metals.

The intermediate layer 133 included between the pixel electrode 131 and the facing electrode 134 can be formed of a small molecular weight organic material or a polymer organic material. When the intermediate layer 133 is formed of a small molecular weight organic material, the intermediate layer 133 can be formed in a single or a composite structure by stacking a hole injection layer (HIL), a hole transport layer (HTL), an emission layer (EML), an electron transport layer (ETL), and an electron injection layer (EIL). Organic materials that can be used for forming the intermediate layer include copper phthalocyanine (CuPc), N,N'-Di(naphthalene-1-yl)-N,N'-diphenyl-benzidine (NPB), and tris-8-hydroxyquinoline aluminum (Alq3), but the present invention is not limited thereto. Small molecular weight organic material layers can be formed by a vacuum evaporation method using masks.

When the intermediate layer 133 is formed of a polymer organic material, the intermediate layer 133 can have a structure that includes an HTL and an EML. The polymer HTL can be formed of poly-(2,4)-ethylene-dihydroxy thiophene (PEDOT), and the light emitting layer can be formed of polyphenylenevinylene (PPV) and polyfluorene group polymers.

An organic light emitting diode formed on the substrate 110 is sealed by a facing member (not shown). The facing member, like the substrate 110, can be formed of glass, plastic, or metal.

An organic light emitting display apparatus that can realize correct images according to inputted signals can be manufactured by including organic thin film transistors according to embodiments and modified embodiments of the present invention. Also, aspects of the present invention have been described mainly with regard to the structure of an organic light emitting display apparatus, but any display apparatus that includes an organic thin film transistor can be applied to the present invention.

An organic thin film transistor, a flat panel display apparatus having the organic thin film transistor, and a method of manufacturing the organic thin film transistor according to aspects of the present invention can provide the following and/or other advantages. First, contact resistance between source and drain electrodes and an organic semiconductor layer can be greatly reduced by including a conductive polymer layer between the source and drain electrodes and the organic semiconductor layer. Second, the conductive polymer layer can be formed exclusively between the source and drain electrodes and the organic semiconductor layer at low costs by employing a hydrophobic material layer. Third, the flexibility of a flat panel display apparatus can further be increased by including organic thin film transistors having improved characteristics.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic thin film transistor, comprising:
    forming source and drain electrodes;
    forming a hydrophobic material layer covering the source and drain electrodes on an entire surface of a layer on which the source and drain electrodes are formed;
    removing the hydrophobic material layer at least on a region of each of the source and drain electrodes;
    forming a conductive polymer layer on regions where the hydrophobic material layer is removed; and
    forming an organic semiconductor layer to be electrically connected to the source and drain electrodes.

2. The method of claim 1, wherein the removing of the hydrophobic material layer comprising removing the hydrophobic material layer on an edge of the source electrode in a drain electrode direction and removing the hydrophobic material layer on an edge of the drain electrode in a source electrode direction.

3. The method of claim 1, wherein the removing of the hydrophobic material layer comprising removing the hydrophobic material layer on the source electrode and removing the hydrophobic material layer on the drain electrode.

4. The method of claim 1, wherein one of the source electrode, the drain electrode and combination thereof is formed of a transparent material.

5. The method of claim 4, wherein one of the source electrode, the drain electrode and a combination thereof is formed of ITO, IZO, ZnO, or $In_2O_3$.

6. The method of claim 1, wherein the hydrophobic material layer is formed of a surface treatment agent that has a self-assembled monolayer including silane moiety having 1-3 reactive halogen atoms or alkoxy moieties, and including 1-3 hydrophobic moieties.

7. The method of claim 6, wherein the hydrophobic material layer is formed of a surface treatment agent that has a hydrophobic self-assembled monolayer having a trichlorosilanyl moiety or a trialkoxysilanyl moiety at an end thereof.

8. The method of claim 7, wherein the hydrophobic material layer is formed of OTS.

9. The method of claim 1, wherein the conductive polymer layer is formed of PEDOT or PANI.

10. The method of claim 1, wherein the forming of the hydrophobic material layer is performed using a spin coating method or a dipping method.

11. The method of claim 1, wherein the removing of the hydrophobic material layer comprises irradiating a laser beam onto regions where the hydrophobic material layer is removed.

12. The method of claim 1, wherein the forming of the conductive polymer layer comprises using a spin coating method, a dipping method, or an inkjet printing method.

13. The method of claim 1, wherein the forming of the conductive polymer layer comprises:
    forming the conductive polymer layer in regions on the source and drain electrodes where the hydrophobic material layer is removed using a spin coating method, a dipping method, or an inkjet printing method; and
    removing the conductive polymer layer remaining on a region between the source and drain electrodes.

14. The method of claim 13, wherein the removing of the conductive polymer layer remaining on a region between the source and drain electrodes comprises irradiating a laser beam, ultraviolet rays, or an electron beam onto the region between the source and drain electrodes.

15. The method of claim 1, further comprising:
    forming a gate insulating film covering the organic semiconductor layer; and
    forming a gate electrode on the gate insulating film.

16. The method of claim 1, prior to forming the source and drain electrodes, further comprising:
    forming a gate electrode; and
    forming a gate insulating film covering the gate electrode, wherein the source and drain electrodes are formed on the gate insulating film.

* * * * *